United States Patent [19]

Loos et al.

[11] Patent Number: 5,285,160
[45] Date of Patent: Feb. 8, 1994

[54] MAGNETIC RESONANCE APPARATUS COMPRISING ADJACENTLY ARRANGED RF COILS SYSTEMS

[75] Inventors: Albertus L. J. G. M. Loos; Otto R. A. M. Selder; Teunis R. Van Heelsbergen, all of Eindhoven, Netherlands

[73] Assignee: U.S. Philips Corporation, New York, N.Y.

[21] Appl. No.: 926,575

[22] Filed: Aug. 6, 1992

[51] Int. Cl.⁵ ............................................. G01V 3/00
[52] U.S. Cl. .................................. 324/318; 128/653.5
[58] Field of Search ............. 324/300, 307, 309, 318, 324/322; 128/653.5

[56] References Cited

U.S. PATENT DOCUMENTS

| | | | |
|---|---|---|---|
| 4,684,894 | 8/1987 | Bliehall | 324/318 |
| 4,694,255 | 9/1987 | Hayes | 324/318 |
| 4,777,438 | 10/1988 | Holland | 324/309 |
| 4,791,371 | 12/1988 | Krol | 324/318 |
| 4,816,765 | 3/1989 | Boskamp | 324/318 |
| 4,943,775 | 7/1990 | Boskamp et al. | 324/322 |

*Primary Examiner*—Louis Arana
*Attorney, Agent, or Firm*—Jack D. Slobod

[57] ABSTRACT

Magnetic resonance apparatus includes a main magnet system (1) for generating a steady magnetic field, a magnet system (3) for generating gradient fields, an RF transmitter coil (9) and an RF receiver coil system (13) which includes first and second RF coil systems (47, 49) for detecting resonance signals generated in respective first and second regions of an object to be arranged on a supporting face (43), said regions being adjacently situated in a first direction (57), each of the first and second RF coil systems comprising at least a surface coil. The apparatus is intended notably for the examination of the spine of a patient arranged on the supporting face (43), the first region containing the thoracic segment of the spine (T-spine) and the second region containing the lumbar segment (L-spine). In order to enable easy adaptation of the position of the second RF coil system (49) to the location of the L-spine of an individual patient, the first RF coil system (47) is arranged to be stationary relative to the supporting face (43) in a first coil plane (53) extending substantially parallel to the supporting face, whereas the second RF coil system (49) is arranged to as to be displaceable in the first direction (57) in a second coil plane (61) which extends parallel to the first coil plane (53).

20 Claims, 2 Drawing Sheets

MAGNETIC RESONANCE APPARATUS COMPRISING ADJACENTLY ARRANGED RF COILS SYSTEMS

BACKGROUND OF THE INVENTION

1. Field of the Invention

The invention relates to a magnetic resonance apparatus having a first and second RF coil systems for the detection of resonance signals generated in respective first and second regions of an object, which regions are adjacently situated in a first direction, each of said first and second RF coil systems including a surface coil.

2. Background of the Invention

An apparatus of this kind is known, for example from U.S. Pat. No. 4,777,438. Apparatus of this kind is particularly suitable for the examination of a comparatively long object which cannot very well be studied in its entirety because its dimensions are greater than the diameter of the uniform part of the steady magnetic field. An example of such an object is the human spine. The known apparatus comprises two adjacently situated RF coil systems, the first of which serves for the examination of the thoracic segment of the spine (T-spine), the second coil system being used for the examination of the lumbar segment (L-spine). It is a drawback of the known solution that the fact that the overall length of the spine may vary strongly from one patient to another is not taken into account sufficiently. Notably the location of the transition from the T-spine to the L-spine differs substantially in small patients (for example children) and large patients. Examination of such different patients by means of the known apparatus, therefore, is very difficult, because for each patient a new position of the two RF coil systems must be found, implying a comparatively intricate readjustment of the apparatus. When the RF coil systems are positioned anew, the patient must each time be lifted off the patient table.

SUMMARY OF THE INVENTION

It is an object of the invention to provide a magnetic resonance apparatus of the kind set forth which can be readily adapted to the examination of patients of greatly varying length. To achieve this, the apparatus in accordance with the invention is characterized in that the first RF coil system is arranged so as to be stationary relative to the supporting face in a first coil plane which extends substantially parallel to the supporting face, the second RF coil system being arranged so as to be displaceable in the first direction in a second coil plane which extends parallel to the first coil plane. The invention is based on the recognition of the fact that the transition between the cervical segment of the spine (C-spine) and the thoracic segment is situated in substantially the same location for all patients, that is to say in the lower part of the neck. Therefore, a patient can always be positioned so that his T-spine is situated in a well-defined location, for example by arranging a head rest in a predetermined position relative to the supporting face. When the first RF coil system intended for the examination of the T-spine has been arranged in a suitable position relative to this support, the T-spine will always automatically occupy the correct position relative to this coil system. The second RF coil system can then be displaced until it occupies the correct position relative to the L-spine. It is not necessary to move the patient during this operation. A compact and elegant construction is obtained in an embodiment of the invention which is characterized in that the first and the second RF coil system are accommodated in a housing which occupies a predetermined position relative to the supporting face.

In order to facilitate the positioning of the second RF coil system relative to the patient, a preferred embodiment of the invention is characterized in that the second RF coil system is provided with a position indicator which is operative to indicate the position of the second RF coil system.

The first and the second RF coil system are preferably formed as quadrature coil systems. Suitable quadrature coil systems and their advantages are described, for example in EP-A-0 274 773.

In some cases it is desirable to examine the entire spine, that is to say the C-spine included. A further embodiment is particularly suitable for such examinations and is characterized in that the RF receiver coil system comprises a third RF coil system which is arranged, viewed in the first direction, in a predetermined position at the side of the first RF coil system which is remote from the second RF coil system. The third RF coil system may be, for example a surface quadrature coil system or a volume quadrature coil system as described in EP-A-0 141 383, FIG. 5D. The first RF coil system then preferably comprises a portion which partly overlaps the third RF coil system. This enables imaging of the entire transition between the C-spine and the T-spine.

BRIEF DESCRIPTION OF THE DRAWING

These and other aspects of the invention will be described in detail hereinafter with reference to the drawing, wherein.

DETAILED DESCRIPTION OF THE PREFERRED EMBODIMENT

Figure 1:
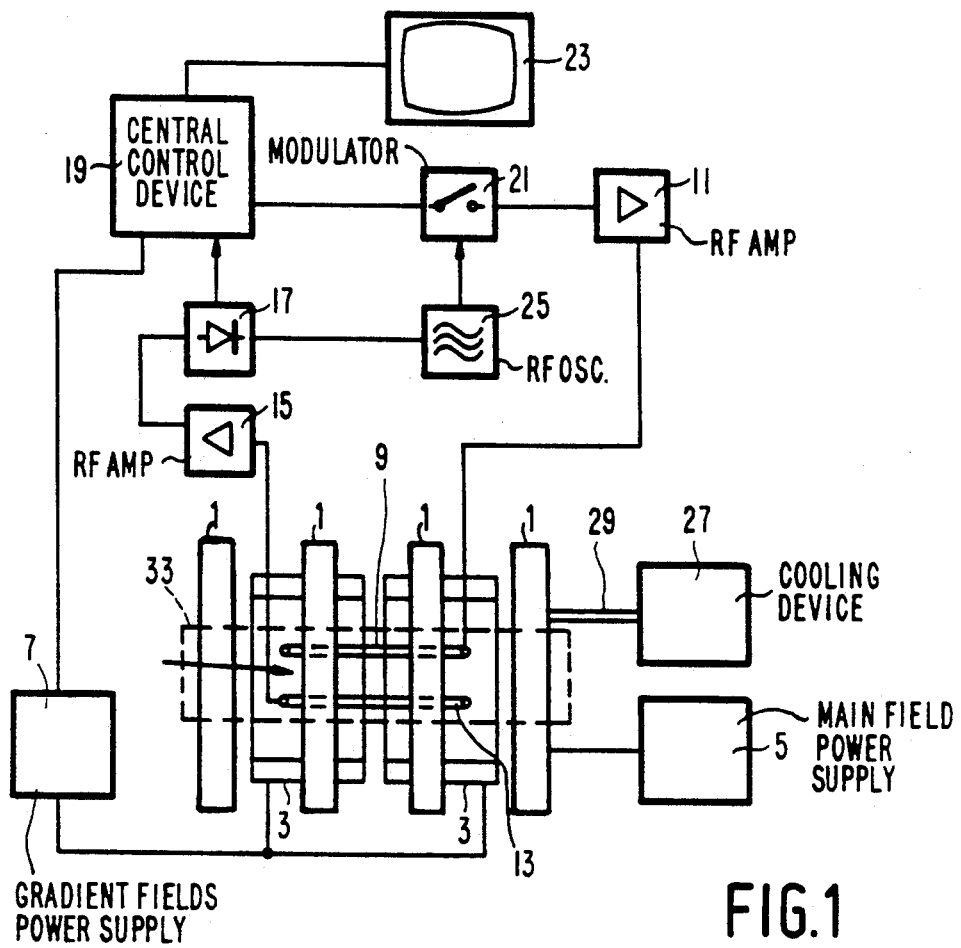
FIG. 1 shows diagrammatically an embodiment of a magnetic resonance apparatus in accordance with the invention.

A magnetic resonance apparatus as shown diagrammatically in FIG. 1 comprises a magnet system 1 for generating a steady, uniform main magnetic field, a magnet system 3 for generating magnetic gradient fields, and power supply sources 5 and 7 for the magnet system 1 and the magnet system 3, respectively. A magnet coil system 9, intended to generate an RF magnetic alternating field (referred to hereinafter as the RF transmitter coil) is connected to the output of amplifier an RF 11. For detection of magnetic resonance signals generated by the RF transmitter field in an object to be examined, there is provided an RF receiver coil system 13. For read-out purposes the coil system 13 is connected to the input of signal RF amplifier 15. The output of the signal RF amplifier 15 is connected to a phase-sensitive rectifier 17 which is connected to a central control device 19. The central control device 19 also controls a modulator 21 feuding the RF amplifier 11, the power supply 7 for the gradient coils 3, and a monitor 23 for display. An RF oscillator 25 controls the modulator 21 as well as the phase-sensitive rectifier 17 processing the measurement signals. For cooling, if necessary, there is provided a cooling device 27 which comprises cooling ducts 29. A cooling device of this kind may be constructed as a water cooling system for resistive coils or as a liquid nitrogen or helium dewar system for superconducting coils. The RF transmitter coil 9 is arranged within the magnet systems 1 and 3 and generates RF magnetic fields in a measurement space 31 which, in the case of an apparatus for medical diagnostic measurements, offers adequate space to accommodate patients. A steady magnetic field, gradient fields for position selection of slices to be imaged, and a spatially uniform RF alternating field can thus be generated within the measurement space 31. The measurement space 31 is shielded against stray fields by a Faraday cage 33.

Figure 2:
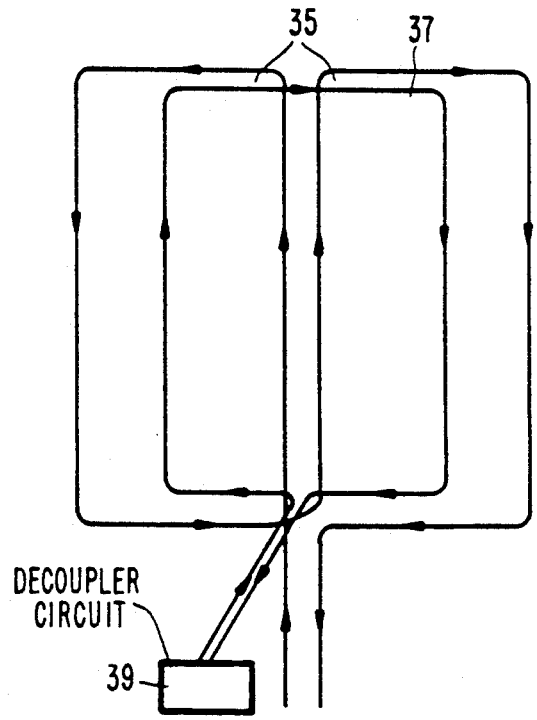
FIG. 2 shows an embodiment of an RF coil system for use in the apparatus shown in FIG. 1.

FIG. 2 shows diagrammatically an embodiment of an RF coil system forming part of the RF receiver coil system 13. It is constructed as a quadrature surface coil system consisting of a first receiver coil 35 in the form of a butterfly coil and a second receiver coil 37 in the form of a single, flat coil. Because of the geometry, the butterfly coil 35 is decoupled for the transmission field to be used; however, because this does not hold for the flat coil 37, a known decoupler circuit 39 is added thereto. The circumferential shape of the coils 35, 37 can be adapted to the shape of the object to be examined and may also be, for example mainly circular or elliptical. The RF receiver coil system 13 preferably comprises two of such RF coil systems. One of these RF coil systems, or both, may also have a different construction, for example a construction in the form of single, flat coils.

Figure 3:
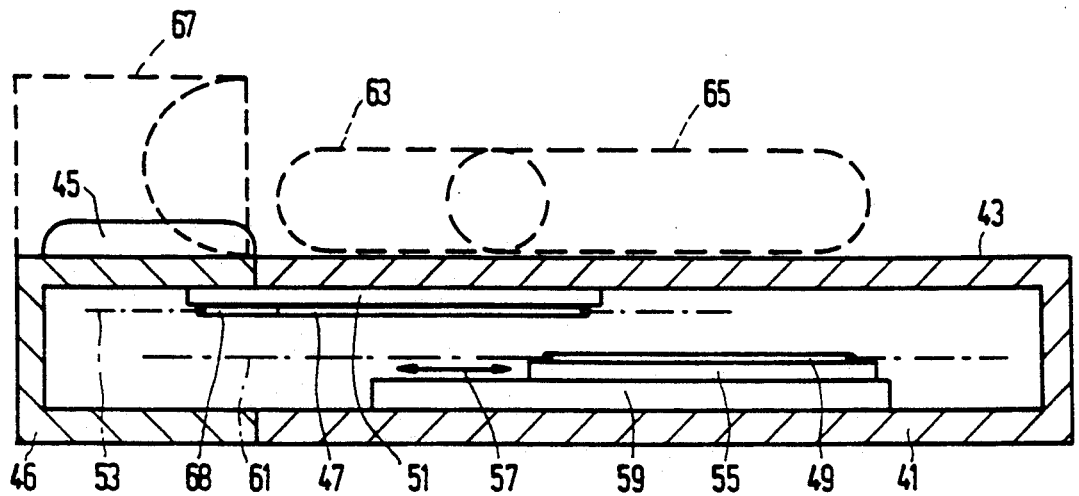
FIG. 3 is a longitudinal sectional view of an embodiment of a part of the apparatus shown in FIG. 1.

FIG. 3 is a sectional side elevation of an embodiment of a housing 41 in which the first and the second RF coil system are accommodated. The housing 41 can be arranged, for example on a displaceable patient table (not shown). The housing 41 is constructed as a rectangular case covered by an upper surface 43 which constitutes a supporting face on which a patient to be examined (not shown) can be arranged so that the patient's head is oriented to the left. A head rest 45 for supporting the head of the patient is arranged in a predetermined position relative to the supporting face 43. The head rest 45 may be mounted on a carrier 46 which can be secured to the housing 41. The housing 41 accommodates a first RF coil system 47 and a second RF coil system 49. Via a first coil base 51, the first RF coil system 47 is permanently connected to the lower side of the supporting face 43. It is situated in a first coil plane 53 (denoted by a dash-dot line) extending parallel to the supporting face 43. The second RF coil system 49 is mounted on a second coil base 55 which is displaceable in a first direction 57 (denoted by a double arrow) relative to the housing 41. To this end, the second coil base 55 is connected, via a guide mechanism 59 (for example a pair of rails extending in the first direction 57) to the bottom of the housing 41. The second coil base 55 is displaceable in the guide mechanism 59 so that the second RF coil system 49 is displaceable in the first direction 57 in a second coil plane 61 (denoted by a dash-dot line) which extends parallel to the first coil plane 53. The second coil base 55 can be driven by hand or by means of a motor (not shown).

The first RF coil system 47 is capable of detecting resonance signals generated in a first region which is bounded by a first contour 63 (denoted by a broken line). When the patient rests on the supporting face 43 in the indicated manner, the first region contains the thoracic segment of the spine of the patient (the T-spine). The second RF coil system 49 can be displaced so that it is capable of detecting resonance signals originating from any arbitrary second region which is situated anywhere within a second contour 65 (again denoted by a broken line) and shifted in the first direction 57 relative to the first region. During a practical examination of the spine, the second RF coil system will be arranged so that the second region contains the lumbar segment of the spine (the L-spine). In the case of a short patient (for example, a child), the L-spine will be situated near the left-hand extremity of the space defined by the second contour 65, and in the case of a long patient it will be situated further to the right. The apparatus can thus be adapted to any kind of patient by displacement of the second RF coil system 49. Because the first and the second RF coil system 47, 49 are accommodated within a single housing 41, they are situated very near to the first and the second region to be examined. Consequently, the signal-to-noise ratio is as high as possible.

If desired, the RF receiver coil system 13 may also comprise a third RF coil system 67 (denoted by broken lines in FIG. 3) which is intended to detect resonance signals originating from the cervical segment of the spine (the C-spine) and possibly the head of the patient. The third RF coil system 67 is arranged at the side (the left-hand side in FIG. 3) of the first RF coil system 47 which is remote from the second RF coil system 49, preferably on the support 46. It may be constructed, for example as a so-called bird-cage coil comprising cutouts for the shoulders as disclosed in EP-A-0 141 383, notably in FIG. 5D. The third RF coil system 67, however, may alternatively have a different shape, for example the shape of a quadrature coil system as shown in FIG. 2. In the latter case the third RF coil system 67 will preferably be secured underneath the head rest 45, approximately in the same way as the first RF coil system 47. Because the transition between the C-spine and the T-spine is situated in substantially the same location for all patients, the first and the third RF coil system 47, 67 can both be arranged in a predetermined position relative to the supporting face 43. In order to ensure that this transition can also be entirely examined, the first RF coil system 47 comprises a part 68 which partly overlaps the third RF coil system 67. The part 68 may be constructed as a protrusion formed on the first RF coil system and extending underneath or within the third RF coil system 67.

Figure 4:
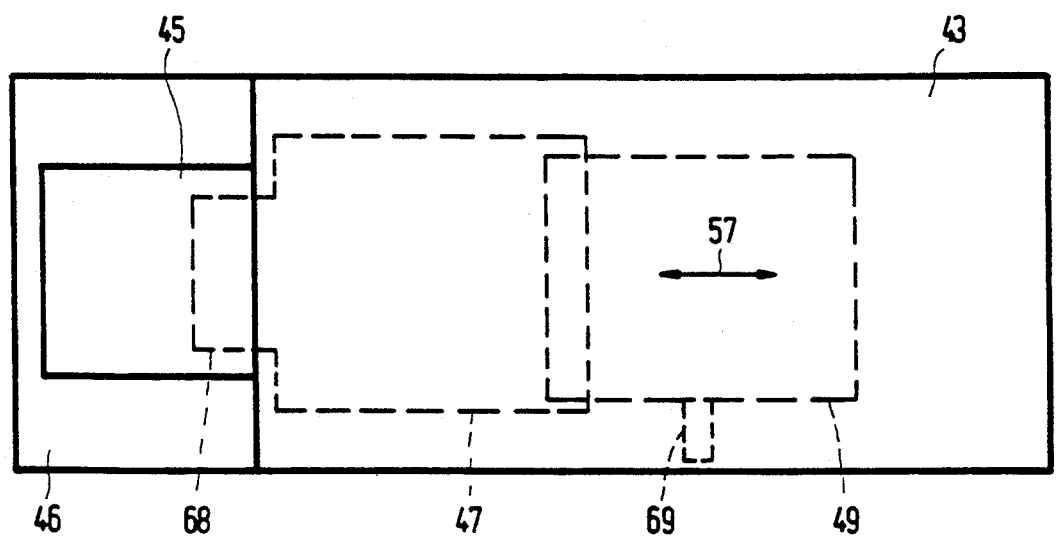
FIG. 4 is a plan view of the part shown in FIG. 3.

FIG. 4 is a plan view of the supporting face 43 in which the third RF coil system 67 has been omitted. The first 47 and the second RF coil system 49, arranged underneath the supporting face 43, are diagrammatically denoted by broken lines. A position indicator 69 which indicates the position of the second RF coil system is connected to the second RF coil system 49 which is movable in the first direction. In its simplest form the position indicator 69 is a pointer which is secured to the second coil base 55 and which is visible through the side wall of the housing 41, for example via a window (not shown) provided in the side wall. If desired, the position indicator 69 may also have a different construction, for example it may comprise a contact member which slides along a resistance track and which cooperates with electronic position sensing means. When a patient is arranged on the supporting face 43, the second RF coil system 49 can be positioned by means of the position indicator 69 so that the centre of this coil system is situated underneath a predetermined part of the body of the patient. The patient may remain in position during this displacement of the second RF coil system. Subsequently, the patient table on which the housing 41 is arranged can be moved into the magnet system 1 (FIG. 1) until the part of the patient to be examined is situated within the uniform part of the magnetic field generated by this magnet system. The entire spine can thus be examined in parts, without it being necessary to move the patient relative to the patient table.

We claim:

1. A magnetic resonance apparatus, comprising a magnet system (1) for generating a steady magnetic field, a magnet system (3) for generating gradient fields, an RF transmitter coil (9) and an RF receiver coil system (13) comprising first and second RF coil systems (47, 49) for the detection of resonance signals generated in first and second regions of an object to be arranged on a supporting face (43), which regions are adjacently situated in a first direction (57), each of said first and second RF coil systems comprising at least a surface coil, characterized in that the first RF coil system (47) is arranged in a predetermined stationary position relative to the supporting face (43) and the second RF coil system (49) is carried by means for displacing the position of said second RF coil system (49) in the first direction relative to the first RF coil system (43) in order to enable adjustment of the location of the second RF coil system relative to the first RF coil system to accommodate an actual distance in the first direction between the first and second regions in the object.

2. A magnetic resonance apparatus as claimed in claim 1, characterized in that the first and the second RF coil systems (47, 49) are accommodated in a housing (41) which occupies a predetermined stationary position relative to the supporting face (43).

3. A magnetic resonance apparatus as claimed in claim 1, characterized in that the means for displacing the position of the second RF coil system (49) is provided with a position indicator (69) which is operative to indicate the position of the second RF coil system.

4. A magnetic resonance apparatus as claimed in claim 1, characterized in that the first and the second RF coil systems (47, 49) are formed as quadrature coil systems.

5. A magnetic resonance apparatus as claimed in claim 1, characterized in that the RF receiver coil system (13) further comprises a third RF coil system (67) which is arranged, viewed in the first direction (57), in a predetermined position at a side of the first RF coil system (47) which is remote from the second RF coil system (49).

6. A magnetic resonance apparatus as claimed in claim 5, characterized in that the first RF coil system comprises a portion which partly overlaps the third RF coil system.

7. A magnetic resonance apparatus as claimed in claim 2, characterized in that the means for displacing the position of the second RF coil system (49) is provided with a position indicator (69) which is operative to indicate the position of the second RF coil system.

8. A magnetic resonance apparatus as claimed in claim 2, characterized in that the first and the second RF coil systems (47, 49) are formed as quadrature coil systems.

9. A magnetic resonance apparatus as claimed in claim 3, characterized in that the first and the second RF coil systems (47, 49) are formed as quadrature coil systems.

10. A magnetic resonance apparatus as claimed in claim 7, characterized in that the first and the second RF coil systems (47, 49) are formed as quadrature coil systems.

11. A magnetic resonance apparatus as claimed in claim 2, characterized in that the RF receiver coil system (13) further comprises a third RF coil system (67) which is arranged, viewed in the first direction (57), in a predetermined position at a side of the first RF coil system (47) which is remote from the second RF coil system (49).

12. A magnetic resonance apparatus as claimed in claim 3, characterized in that the RF receiver coil system (13) further comprises a third RF coil system (67) which is arranged, viewed in the first direction (57), in a predetermined position at a side of the first RF coil system (47) which is remote from the second RF coil system (49).

13. A magnetic resonance apparatus as claimed in claim 4, characterized in that the RF receiver coil system (13) further comprises a third RF coil system (67) which is arranged, viewed in the first direction (57), in a predetermined position at a side of the first RF coil system (47) which is remote from the second RF coil system (49).

14. A magnetic resonance apparatus as claimed in claim 7, characterized in that the RF receiver coil system (13) further comprises a third RF coil system (67) which is arranged, viewed in the first direction (57), in a predetermined position at a side of the first RF coil system (47) which is remote from the second RF coil system (49).

15. A magnetic resonance apparatus as claimed in claim 8, characterized in that the RF receiver coil system (13) further comprises a third RF coil system (67) which is arranged, viewed in the first direction (57), in a predetermined position at a side of the first RF coil system (47) which is remote from the second RF coil system (49).

16. A magnetic resonance apparatus as claimed in claim 9, characterized in that the RF receiver coil system (13) further comprises a third RF coil system (67) which is arranged, viewed in the first direction (57), in a predetermined position at a side of the first RF coil system (47) which is remote from the second RF coil system (49).

17. A magnetic resonance apparatus as claimed in claim 10, characterized in that the RF receiver coil system (13) further comprises a third RF coil system (67) which is arranged, viewed in the first direction (57), in a predetermined position at a side of the first RF coil system (47) which is remote from the second RF coil system (49).

18. A magnetic resonance apparatus as claimed in claim 4, characterized in that the first RF coil system comprises a portion which partly overlaps the third RF coil system.

19. A magnetic resonance apparatus as claimed in claim 13, characterized in that the first RF coil system comprises a portion which partly overlaps the third RF coil system.

20. A magnetic resonance apparatus as claimed in claim 17, characterized in that the first RF coil system comprises a portion which partly overlaps the third RF coil system.

* * * * *